US012693268B2

(12) United States Patent
Ryu et al.

(10) Patent No.: US 12,693,268 B2
(45) Date of Patent: Jul. 28, 2026

(54) SEMICONDUCTOR DEVICE TESTING APPARATUS AND METHODS OF TESTING AND FABRICATING SEMICONDUCTOR DEVICE USING THE SAME

(71) Applicant: Samsung Electronics Co., Ltd., Suwon-si (KR)

(72) Inventors: Sung Yoon Ryu, Suwon-si (KR); Donghyun Lee, Suwon-si (KR); Sooseok Lee, Suwon-si (KR); Younghoon Sohn, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 780 days.

(21) Appl. No.: 18/093,037

(22) Filed: Jan. 4, 2023

(65) Prior Publication Data

US 2023/0366853 A1      Nov. 16, 2023

(30) Foreign Application Priority Data

May 16, 2022    (KR) ........................ 10-2022-0059466

(51) Int. Cl.
| | |
|---|---|
| *G01N 29/04* | (2006.01) |
| *G01N 29/24* | (2006.01) |
(Continued)

(52) U.S. Cl.
CPC .......... *G01N 29/043* (2013.01); *G01N 29/24* (2013.01); *G01N 29/265* (2013.01); *H10P 74/23* (2026.01); *G01N 2291/0289* (2013.01)

(58) Field of Classification Search
CPC .... G01N 29/043; G01N 29/24; G01N 29/265; G01N 2291/4436; G01N 29/2406;
(Continued)

(56) References Cited

U.S. PATENT DOCUMENTS

| | | | | |
|---|---|---|---|---|
| 5,716,218 A | * | 2/1998 | Farnworth | .......... H01L 21/6835 257/E23.07 |
| 7,777,345 B2 | * | 8/2010 | Lee | ........................ H01L 24/03 257/734 |

(Continued)

FOREIGN PATENT DOCUMENTS

| | | | | |
|---|---|---|---|---|
| JP | 2018100852 A | * | 6/2018 | |
| JP | 2018179518 A | * | 11/2018 | ......... G01N 29/2456 |

(Continued)

*Primary Examiner* — John E Breene
(74) *Attorney, Agent, or Firm* — Muir Patent Law, PLLC

(57)        ABSTRACT

A method of fabricating a semiconductor device may include disposing a first aperture on a surface of a substrate; positioning a first ultrasonic wave receiving probe on the surface of the substrate in the first aperture; disposing a second aperture on the surface of the substrate; positioning a second ultrasonic wave receiving probe on the surface of the substrate in the second aperture; transmitting an ultrasonic wave to the substrate; and receiving a reflection ultrasonic wave, which is reflected by a portion in the substrate. The receiving of the reflection ultrasonic wave comprises one of: receiving the reflection ultrasonic wave, which is transmitted through the first aperture, using the first ultrasonic wave receiving probe positioned on the surface of the substrate; and receiving the reflection ultrasonic wave, which is transmitted through the second aperture, using the second ultrasonic wave receiving probe positioned on the surface of the substrate. The first ultrasonic wave receiving probe and the second ultrasonic wave receiving probe are spaced apart from each other in a horizontal direction.

18 Claims, 12 Drawing Sheets

(51) Int. Cl.
*G01N 29/265* (2006.01)
*H10P 74/00* (2026.01)

(58) Field of Classification Search
CPC ........... G01N 29/2437; G01N 29/2412; G01N 2291/2697; G01N 2291/0289; G01N 29/04; G01N 29/36; G01N 2291/044; G01N 2291/048; G01N 2291/103; G01N 2291/052; H01L 22/20; H01L 22/12; H01L 22/10
See application file for complete search history.

(56) References Cited

U.S. PATENT DOCUMENTS

| | | | |
|---|---|---|---|
| 8,038,895 | B2 | 10/2011 | Koester et al. |
| 9,417,283 | B2 * | 8/2016 | Whetsel ......... G01R 31/318544 |
| 9,891,233 | B2 * | 2/2018 | Ausiello ................ C07K 16/18 |
| 9,991,176 | B2 | 6/2018 | Mehendale et al. |
| 10,667,392 | B2 * | 5/2020 | Wang ..................... H05K 3/303 |
| 10,921,291 | B2 | 2/2021 | Ininger et al. |
| 11,733,287 | B2 * | 8/2023 | Li ...................... G01R 31/2601 |
| | | | 324/762.01 |
| 2009/0189278 | A1 * | 7/2009 | Komatsu ................ G01N 29/28 |
| | | | 257/729 |
| 2009/0205291 | A1 * | 8/2009 | Antonevich ............. B65B 9/02 |
| | | | 53/450 |
| 2011/0061465 | A1 | 3/2011 | Kraemer |
| 2012/0304773 | A1 | 12/2012 | Horibe et al. |
| 2017/0205500 | A1 * | 7/2017 | Kiyose ............... G01S 7/52079 |

FOREIGN PATENT DOCUMENTS

| | | | |
|---|---|---|---|
| JP | | 6934440 B2 | 9/2021 |
| JP | | 2021148440 A | 9/2021 |

* cited by examiner

FIG. 1

SEMICONDUCTOR DEVICE TESTING APPARATUS AND METHODS OF TESTING AND FABRICATING SEMICONDUCTOR DEVICE USING THE SAME

CROSS-REFERENCE TO RELATED APPLICATIONS

This U.S. non-provisional patent application claims priority under 35 U.S.C. § 119 to Korean Patent Application No. 10-2022-0059466, filed on May 16, 2022, in the Korean Intellectual Property Office, the entire contents of which are hereby incorporated by reference.

BACKGROUND OF THE INVENTION

The present disclosure relates to a semiconductor device testing apparatus and methods of testing and fabricating a semiconductor device using the same, and in particular, to a semiconductor device testing apparatus configured to perform an accurate test process using an ultrasonic wave and methods of testing and fabricating a semiconductor device using the same.

A semiconductor device is fabricated through various processes. For example, the semiconductor device is fabricated by performing a photolithography process, an etching process, a deposition process, and a test process on a wafer (e.g., a silicon wafer). The test process is performed to examine whether there is a defect in a semiconductor device. More specifically, the test process is performed to detect a defect (e.g., void, crack, and/or delamination) in the semiconductor device. Various non-destructive test methods are used to detect defects in the semiconductor devices without a step of cutting the semiconductor device.

SUMMARY

An embodiment of the inventive concept provides a semiconductor device testing apparatus, which is configured to examine the presence or absence of a defect through a non-destructive test process without a step of cutting a semiconductor device, and methods of testing and fabricating a semiconductor device using the same.

An embodiment of the inventive concept provides a semiconductor device testing apparatus, which is configured to accurately examine a position and type of a defect using an ultrasonic wave, and methods of testing and fabricating a semiconductor device using the same.

An embodiment of the inventive concept provides a semiconductor device testing apparatus, which is configured to separately detect defects at several positions of a single semiconductor device through a single test process, and methods of testing and fabricating a semiconductor device using the same.

According to an embodiment of the inventive concept, a method of fabricating a semiconductor device may include disposing a first aperture on a surface of a substrate; positioning a first ultrasonic wave receiving probe on the surface of the substrate in the first aperture; disposing a second aperture on the surface of the substrate; positioning a second ultrasonic wave receiving probe on the surface of the substrate in the second aperture; transmitting an ultrasonic wave to the substrate; and receiving a reflection ultrasonic wave, which is reflected by a portion in the substrate. The receiving of the reflection ultrasonic wave comprises one of: receiving the reflection ultrasonic wave, which is transmitted through the first aperture, using the first ultrasonic wave receiving probe positioned on the surface of the substrate; and receiving the reflection ultrasonic wave, which is transmitted through the second aperture, using the second ultrasonic wave receiving probe positioned on the surface of the substrate. The first ultrasonic wave receiving probe and the second ultrasonic wave receiving probe are spaced apart from each other in a horizontal direction.

According to an embodiment of the inventive concept, a method of fabricating a semiconductor device may include transmitting an ultrasonic wave to a substrate; disposing an ultrasonic wave receiving probe through an aperture at a first reception position on a surface of the substrate; moving the ultrasonic wave receiving probe and disposing the moved ultrasonic wave receiving probe through an aperture at a second reception position on the surface; and receiving a reflection ultrasonic wave, which is reflected by a portion in the substrate. The receiving of the reflection ultrasonic wave comprises one of: receiving a first reflection ultrasonic wave at the first reception position using the ultrasonic wave receiving probe; and receiving a second reflection ultrasonic wave at the second reception position using the moved ultrasonic wave receiving probe. The first reception position and the second reception position are spaced apart from each other in a horizontal direction.

According to an embodiment of the inventive concept, a method of testing a semiconductor device may include transmitting an ultrasonic wave to a substrate and receiving a reflection ultrasonic wave, which is reflected by a portion in the substrate. The receiving of the reflection ultrasonic wave may include disposing an aperture on a surface of the substrate and receiving the reflection ultrasonic wave, which is transmitted through the aperture, using an ultrasonic wave receiving probe positioned on the surface of the substrate.

According to an embodiment of the inventive concept, an apparatus of testing a semiconductor device may include a stage supporting a substrate, an ultrasonic wave transmitting device configured to transmit an ultrasonic wave toward the substrate on the stage, and an ultrasonic wave receiving device disposed on the stage. The ultrasonic wave receiving device may include an aperture, which is disposed on a surface of the substrate on the stage, and an ultrasonic wave receiving probe, which is disposed to pass through the aperture and to contact the substrate on the stage.

BRIEF DESCRIPTION OF THE DRAWINGS

FIG. 1 is a perspective view illustrating a semiconductor device testing apparatus according to an embodiment of the inventive concept.

DETAILED DESCRIPTION

Figure 2:
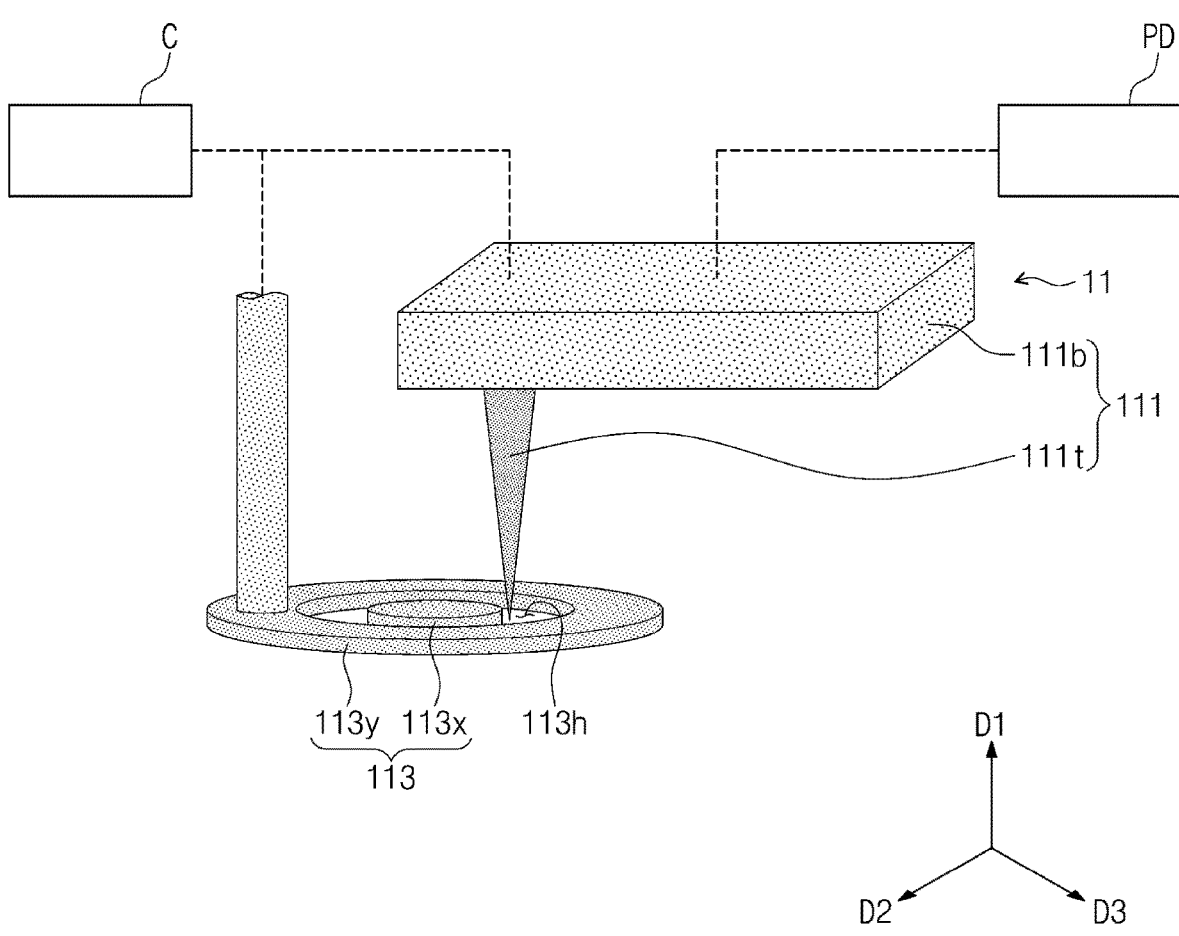
FIG. 2 is a perspective view illustrating an ultrasonic wave transmitting device according to an embodiment of the inventive concept.

Example embodiments of the inventive concepts will now be described more fully with reference to the accompanying drawings, in which example embodiments are shown. Like reference numerals in the drawings denote like elements, and thus their description will be omitted.

Figure 1:
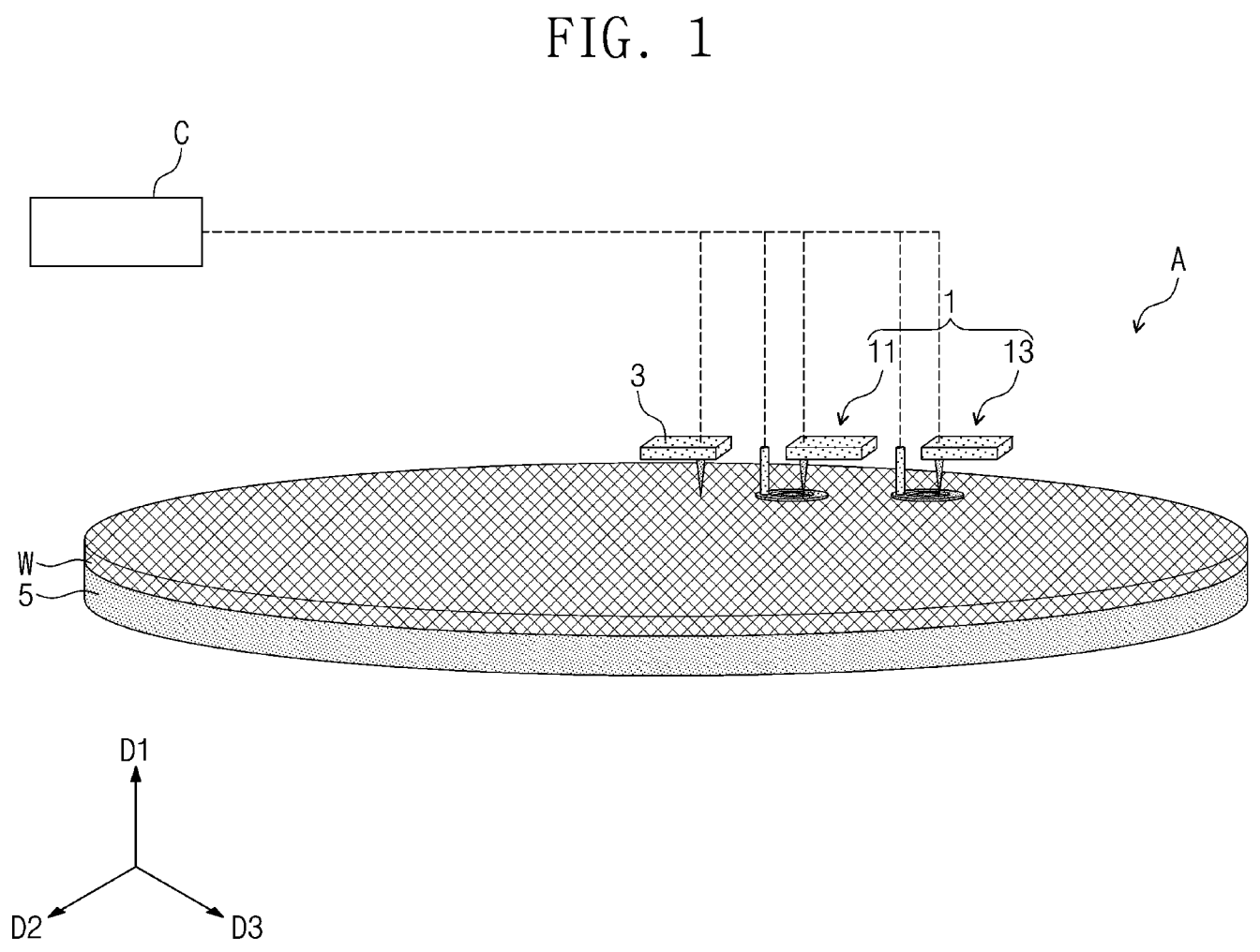

FIG. 1 is a perspective view illustrating a semiconductor device testing apparatus according to an embodiment of the inventive concept.

In the present application, the reference numbers D1, D2, and D3 will be used to denote a first direction, a second direction, and a third direction, respectively, which are not parallel to each other. The first direction D1 may be referred to as a vertical direction. In addition, each of the second and third directions D2 and D3 may be referred to as a horizontal direction. The vertical direction may be perpendicular to a surface of a substrate placed on a stage.

Referring to FIG. 1, a semiconductor device testing apparatus A may be provided. The semiconductor device testing apparatus A may be a device that is configured to perform a test process on a substrate (e.g., a wafer, which may include one or more semiconductor chips formed thereon). However, the inventive concept is not limited to this example, and in an embodiment, the semiconductor device testing apparatus A may be used to test a semiconductor package. For convenience in description, the semiconductor device testing apparatus A will be described as a device that is used to test the substrate (e.g., the wafer). The semiconductor device testing apparatus A may be configured to detect a defect in the substrate. More specifically, the semiconductor device testing apparatus A may examine the number, types, and/or positions of defects in the substrate. For example, the semiconductor device testing apparatus A may detect a defect, such as void, delamination, and crack, in the substrate. To do this, the semiconductor device testing apparatus A may include a stage 5, an ultrasonic wave transmitting device 3, an ultrasonic wave receiving device 1, and a control unit C.

The stage 5 may support a substrate W. The substrate W may include or may be a silicon wafer, but the inventive concept is not limited to this example. In an embodiment, the stage 5 may be configured to fasten the substrate W. For example, the stage 5 may include a chuck that is used to fasten the substrate W. More specifically, the stage 5 may include an electrostatic chuck (ESC) and/or a vacuum chuck. However, the inventive concept is not limited to these examples, and in an embodiment, the substrate W may be simply loaded on the stage 5 during a test process.

The ultrasonic wave transmitting device 3, also described as an ultrasonic wave transmitter, may be configured to transmit an ultrasonic wave to the substrate W on the stage 5. For example, the ultrasonic wave transmitting device 3 may transmit the ultrasonic wave toward the substrate W in the vertical direction. The ultrasonic wave transmitting device 3 may produce the ultrasonic wave in various manners. As an example, the ultrasonic wave transmitting device 3 may produce the ultrasonic wave using a magnetostrictive effect. In an embodiment, the ultrasonic wave transmitting device 3 may include a magnetostrictive ultrasonic transducer. Alternatively, the ultrasonic wave transmitting device 3 may produce the ultrasonic wave using a piezo-electric effect. In an embodiment, the ultrasonic wave transmitting device 3 may include a piezo-electric ultrasonic transducer. However, the inventive concept is not limited to these examples, and in an embodiment, the ultrasonic wave transmitting device 3 may include a capacitive micromachined ultrasonic transducer (cMUT), which is configured to transmit and receive an ultrasonic wave using vibration of a thin film. The ultrasonic wave transmitting device 3 may be placed over the stage 5. For example, the ultrasonic wave transmitting device 3 may be provided over the substrate W on the stage 5 and may be configured to transmit an ultrasonic wave toward the substrate W. However, the inventive concept is not limited to this example, and in an embodiment, the ultrasonic wave transmitting device 3 may be placed below the stage 5. In this case, the ultrasonic wave transmitting device 3 may be provided below the stage 5 and may be configured to transmit an ultrasonic wave toward the substrate W. This will be described in more detail with reference to FIG. 8. The ultrasonic wave transmitting device 3 may be moved to different locations on the surface of the substrate W (e.g., different horizontal positions along the plane formed along the surface of the substrate W) to transmit the ultrasonic wave at different locations.

The ultrasonic wave receiving device 1, also described as an ultrasonic wave receiver may be configured to receive an ultrasonic wave. More specifically, the ultrasonic wave receiving device 1 may receive a reflection ultrasonic wave that is reflected from the substrate W. For example, the ultrasonic wave receiving device 1 may receive a reflection ultrasonic wave, which is emitted from the ultrasonic wave transmitting device 3 and is reflected from a specific position in the substrate. The ultrasonic wave receiving device 1 may convert the received reflection ultrasonic wave to electrical signals. For this, the ultrasonic wave receiving device 1 may include an ultrasonic transducer. The ultrasonic transducer of the ultrasonic wave receiving device 1 may be substantially the same as or similar to that of the ultrasonic wave transmitting device 3. In other words, the ultrasonic wave receiving device 1 may include a magnetostrictive ultrasonic transducer, a piezo-electric ultrasonic transducer, and/or a capacitive micromachined ultrasonic transducer (cMUT). The reflection ultrasonic wave, which is received by the ultrasonic wave receiving device 1, may be converted to electrical signals, and then, the electrical signals may be transmitted to the control unit C.

In an embodiment, a plurality of ultrasonic wave receiving devices 1 (e.g., plurality of ultrasonic wave receivers) may be provided. For example, as shown in FIG. 1, the ultrasonic wave receiving device 1 may include a first ultrasonic wave receiving device 11 and a second ultrasonic wave receiving device 13. The first ultrasonic wave receiving device 11 and the second ultrasonic wave receiving device 13 may be spaced apart from each other in the horizontal direction. For example, the first ultrasonic wave receiving device 11 may be disposed at a first reception position on the substrate W. In addition, the second ultrasonic wave receiving device 13 may be disposed at a second reception position on the substrate W. The first reception position and the second reception position may be spaced apart from each other in the horizontal direction. Due to this disposition, it may be possible to detect defects at various positions in the substrate W (e.g., various vertical positions for each horizontal position of the ultrasonic wave transmitting device 3). This will be described in more detail below. An example, in which two ultrasonic wave receiving devices (e.g., 11 and 13) are provided, has been described, but the inventive concept is not limited to this example. For example, three or more ultrasonic wave receiving devices may be provided.

The control unit C may control the ultrasonic wave transmitting device 3 and the ultrasonic wave receiving device 1. In addition, the control unit C may be configured to analyze signals, which are received by the ultrasonic wave receiving device 1. By analyzing the signal received by the ultrasonic wave receiving device 1, the control unit C may determine the number, types, and/or positions of defects in the substrate W. For this, the control unit C may include a memory and a processor and other hardware and/or software configured to perform the methods described herein. The memory may be an integrated circuit (IC) chip, in which programs, instructions, and data for operations of the ultrasonic wave transmitting device 3 and/or the ultrasonic wave receiving device 1 are stored. The control unit C may be provided in the form of an additional computer. Alternatively, the control unit C may be provided in the form of a device that is coupled to the ultrasonic wave transmitting device 3 and/or the ultrasonic wave receiving device 1.

FIG. 2 is a perspective view illustrating an ultrasonic wave receiving device according to an embodiment of the inventive concept.

Referring to FIG. 2, the first ultrasonic wave receiving device 11 may include a first ultrasonic wave receiving probe 111 and a first aperture 113.

The first ultrasonic wave receiving probe 111 may be disposed to receive an ultrasonic wave. In an embodiment, the first ultrasonic wave receiving probe 111 may convert the ultrasonic wave to electrical signals. For this, the first ultrasonic wave receiving probe 111 may include a first tip 111t and a first probe body 111b. The first tip 111t may have a tapered shape that has a decreasing width in a downward direction. During operation, the first tip 111t may contact the substrate W (e.g., see FIG. 1), but the inventive concept is not limited to this example. The term "contact," "contacting," "contacts," or "in contact with," as used herein, refers to a direct connection (i.e., touching) unless the context clearly indicates otherwise. A reflection ultrasonic wave, which is reflected from the substrate W, may be transmitted to the first probe body 111b through the first tip 111t. The first probe body 111b may support the first tip 111t. An ultrasonic transducer may be placed in the first probe body 111b, but the inventive concept is not limited to this example.

The first aperture 113 may be configured to restrict a range of a received ultrasonic wave. The first aperture 113 may be configured such that only a fraction of the reflection ultrasonic wave, which is reflected from the substrate W (e.g., see FIG. 1), passes through the first aperture 113. More specifically, only a reflection ultrasonic wave, which is reflected at a specific angle or range of angles from a specific point of the substrate W, may pass through the first aperture 113. For this, the first aperture 113 may include a member that is configured to absorb an ultrasonic wave. In addition, the first aperture 113 may provide a hole, through which an ultrasonic wave passes. For example, the first aperture 113 may include an inner blocking member 113x and an outer blocking member 113y. Each of the inner and outer blocking members 113x and 113y may be formed of or include a material that can absorb an ultrasonic wave. For example, each of the inner and outer blocking members 113x and 113y may include a structure coated with a metallic material. More specifically, each of the inner and outer blocking members 113x and 113y may include a structure that is made of glass and is coated with gold. However, the inventive concept is not limited to this example, and in an embodiment, each of the inner and outer blocking members 113x and 113y may include at least one of various structures that can absorb an ultrasonic wave. When viewed in a plan view, the inner blocking member 113x may have a circular shape (e.g., a solid circular shape), as shown in FIG. 2. The outer blocking member 113y may have a ring shape (e.g., a circular ring shape). The outer blocking member 113y may be provided to enclose the inner blocking member 113x, when viewed in a plan view. However, the inventive concept is not limited to this example, and in an embodiment, the inner and outer blocking members 113x and 113y may have different shapes from each other. The outer blocking member 113y may be spaced apart from the inner blocking member 113x in an outward, horizontal direction. An ultrasonic wave receiving hole 113h may be provided between the inner and outer blocking members 113x and 113y. In an embodiment, the ultrasonic wave receiving hole 113h (e.g., which may be an opening in the first aperture 113) may have a ring shape. The first tip 111t may be inserted in the ultrasonic wave receiving hole 113h. More specifically, the first tip 111t may be provided to pass through the ultrasonic wave receiving hole 113h and to contact the substrate W (e.g., see FIG. 1). The reflection ultrasonic wave, which is reflected from the substrate W, may be transmitted to the first ultrasonic wave receiving probe 111 through the ultrasonic wave receiving hole 113h. The inner blocking member 113x and the outer blocking member 113y may be connected to each other. For example, a supporting member (not shown) may be placed between the inner blocking member 113x and the outer blocking member 113y, so that the inner blocking member 113x and the outer blocking member 113y can be connected through the supporting member. Alternatively, a connecting member (not shown) may be connected to an upper surface of the inner blocking member 113x to support the inner blocking member 113x. In this case, the inner blocking member 113x and the outer blocking member 113y may not be connected to each other. However, the embodiments are not limited to these example. In other forms not mentioned above, the inner blocking member 113x and the outer blocking member 113y may be arranged so that the outer blocking member 113y surrounds the inner blocking member 113x.

As shown in FIG. 2, the first aperture 113 may be provided as a separate element that is distinct from the first ultrasonic wave receiving probe 111. For example, the first aperture 113 and the first ultrasonic wave receiving probe 111 may not be combined with each other and may be separately formed and not physically connected to each other. However, the inventive concept is not limited to this example, and in an embodiment, the first aperture 113 and the first ultrasonic wave receiving probe 111 may be provided as a single structure. This will be described in more detail below.

In an embodiment, the first ultrasonic wave receiving probe 111 and the first aperture 113 may be connected to a receiving device driving part PD (also described as a receiving device driver or receiving device position control arm). The receiving device driving part PD may be configured to move each of the first ultrasonic wave receiving probe 111 and the first aperture 113. For this, the receiving device driving part PD may include an actuator (e.g., a motor). Each of the first ultrasonic wave receiving probe 111 and the first aperture 113 may be moved by the receiving device driving part PD, on the substrate W.

So far, the first ultrasonic wave receiving device 11 has been described as an example, but the inventive concept is not limited to this example. In addition, the second ultrasonic wave receiving device 13 may also include elements that are the same as or similar to those in the first ultrasonic wave receiving device 11.

Figure 3:
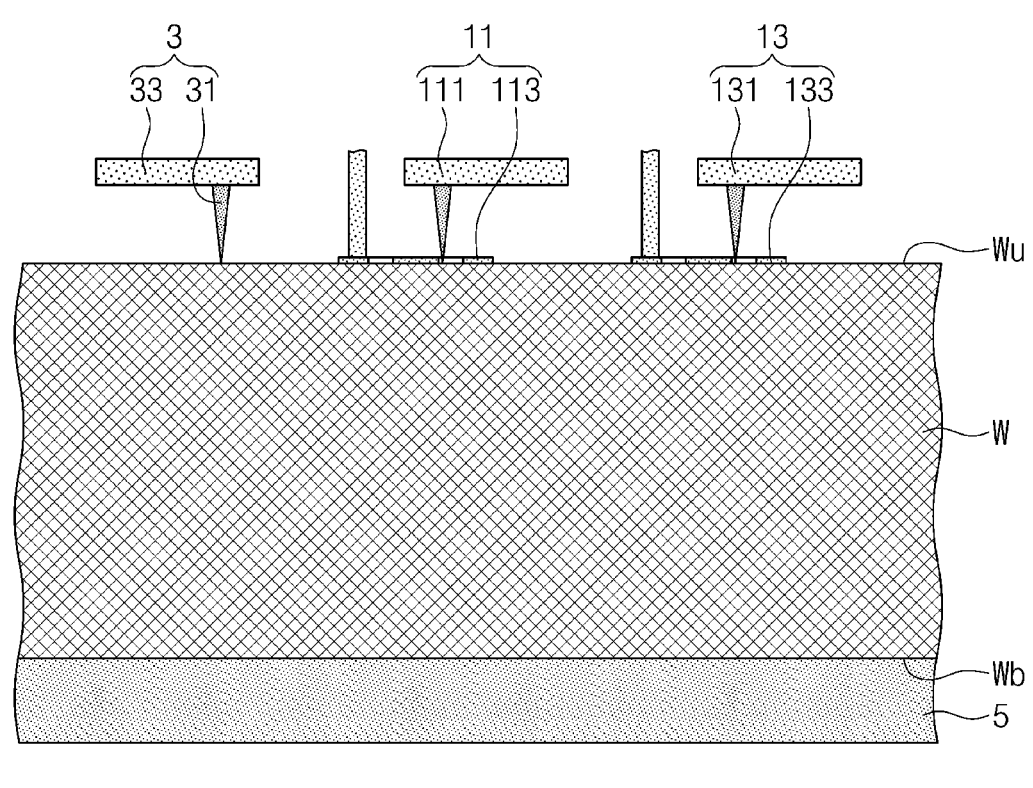
FIG. 3 is a sectional view illustrating a semiconductor device testing apparatus according to an embodiment of the inventive concept.
Figure 3:
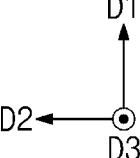

FIG. 3 is a sectional view illustrating a semiconductor device testing apparatus according to an embodiment of the inventive concept.

Referring to FIG. 3, the substrate W may be loaded in the semiconductor device testing apparatus A (e.g., see FIG. 1). More specifically, the substrate W may be loaded on the stage 5. The substrate W may include or be a silicon wafer, as described above, but the inventive concept is not limited to this example. In one embodiment, the substrate W may be formed of a semiconductor material having various layers formed thereon, as will be described in more detail below.

The ultrasonic wave transmitting device 3 may be disposed on a surface Wu of the substrate W. In an embodiment, the surface Wu of the substrate W may be a top surface. A position of the ultrasonic wave transmitting device 3 on the surface Wu of the substrate W may be referred to as a transmission position. The ultrasonic wave transmitting device 3 may include an ultrasonic wave transmitting tip 31 and a transmitting body 33. The ultrasonic wave transmitting tip 31 may have a tapered shape that has a decreasing width in a downward direction. During operation, the ultrasonic wave transmitting tip 31 may contact the surface Wu of the substrate W, but the inventive concept is not limited to this example. The ultrasonic wave transmitting tip 31 may transmit an ultrasonic wave, in a downward direction, through the surface Wu of the substrate W. The transmitting body 33 may support the ultrasonic wave transmitting tip 31. The ultrasonic transducer may be placed in the transmitting body 33, but the inventive concept is not limited to this example.

The first ultrasonic wave receiving device 11 may be disposed on the substrate W. More specifically, the first aperture 113 may be disposed on the surface Wu of the substrate W. The first ultrasonic wave receiving probe 111 may be disposed to be adjacent to the first aperture 113, on the surface Wu of the substrate W. The first ultrasonic wave receiving probe 111 (e.g., a tip of the probe) may be provided to pass through the first aperture 113 and to contact the surface Wu of the substrate W, but the inventive concept is not limited to this example. A position of the first ultrasonic wave receiving probe 111 (e.g., an absolute position, or a position relative to the first ultrasonic wave transmitting device 3) may be referred to as a first reception position.

The second ultrasonic wave receiving device 13 may be disposed on the substrate W. More specifically, a second aperture 133 may be disposed on the surface Wu of the substrate W. A second ultrasonic wave receiving probe 131 may be disposed to be adjacent to the second aperture 133, on the surface Wu of the substrate W. The second ultrasonic wave receiving probe 131 (e.g., a tip of the probe) may be provided to pass through the second aperture 133 and to contact the surface Wu of the substrate W, but the inventive concept is not limited to this example. A position of the second ultrasonic wave receiving probe 131 (e.g., an absolute position, or a position relative to the first ultrasonic wave transmitting device 3 and/or the first ultrasonic wave receiving probe 111) may be referred to as a second reception position. The second ultrasonic wave receiving probe 131 may be spaced apart from the first ultrasonic wave receiving probe 111 in the horizontal direction. For example, the second reception position may be spaced apart from the first reception position in the horizontal direction. Ordinal numbers such as "first," "second," "third," etc. may be used simply as labels of certain elements, steps, etc., to distinguish such elements, steps, etc. from one another. Terms that are not described using "first," "second," etc., in the specification, may still be referred to as "first" or "second" in a claim. In addition, a term that is referenced with a particular ordinal number (e.g., "first" in a particular claim) may be described elsewhere with a different ordinal number (e.g., "second" in the specification or another claim).

A distance between the second reception position and the transmission position may be larger than a distance between the first reception position and the transmission position. for example, distance between the first ultrasonic wave receiving device 11 (e.g., probe tip) and the ultrasonic wave transmitting device 3 (e.g., probe tip) may be smaller than a distance between the second ultrasonic wave receiving device 13 (e.g., probe tip) and the ultrasonic wave transmitting device 3 (e.g., probe tip). Thus, a propagation path of the reflection ultrasonic wave, which is received by the first ultrasonic wave receiving device 11, may be shorter than a propagation path of the reflection ultrasonic wave, which is received by the second ultrasonic wave receiving device 13. This will be described in more detail below.

Figure 4:
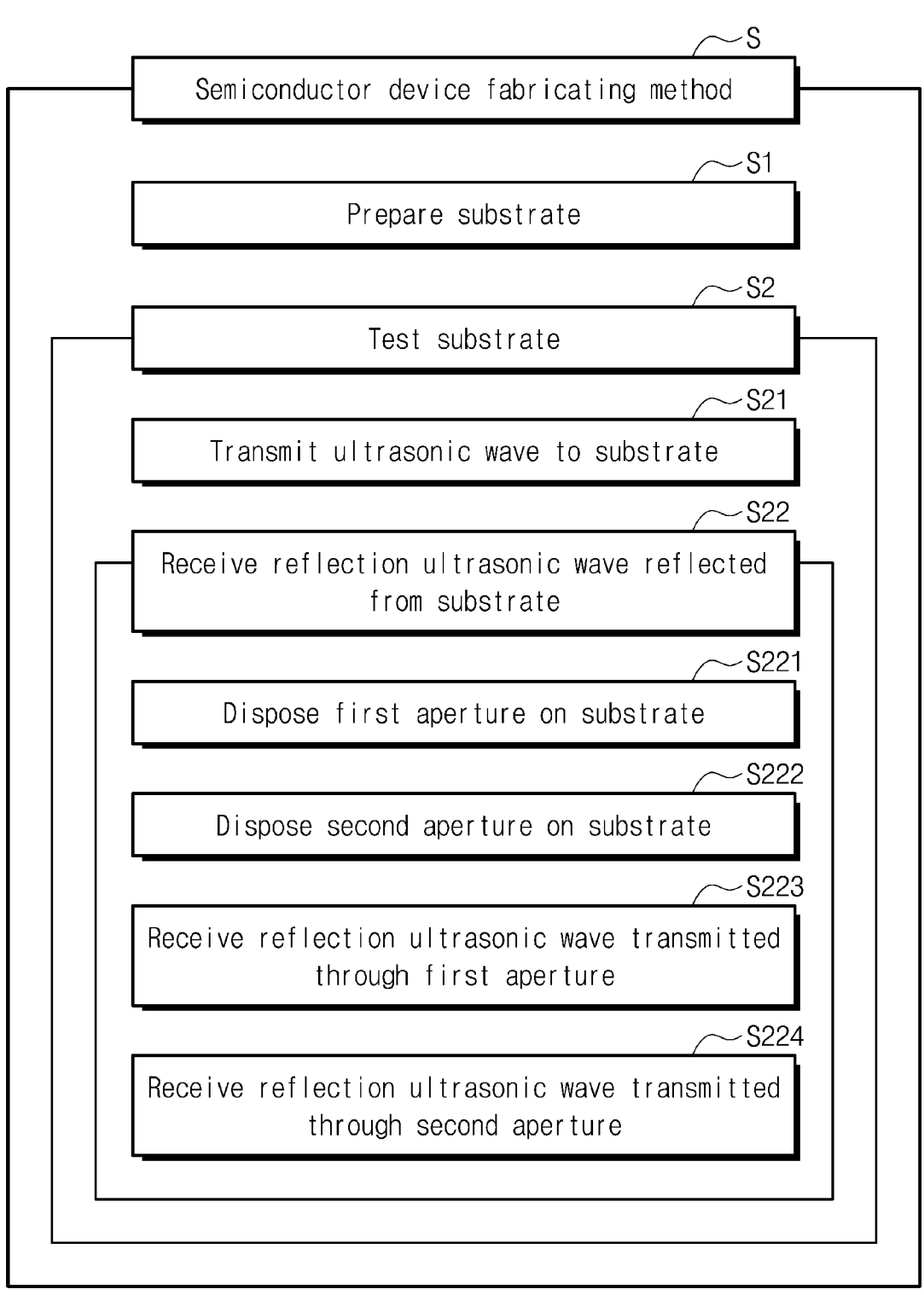
FIG. 4 is a flow chart illustrating a method of fabricating a semiconductor device, according to an embodiment of the inventive concept.

FIG. 4 is a flow chart illustrating a method of fabricating a semiconductor device, according to an embodiment of the inventive concept.

Referring to FIG. 4, a method of fabricating a semiconductor device (in S) may be provided. The semiconductor fabrication method S may include detecting a defect in the substrate using the semiconductor device testing apparatus A described with reference to FIGS. 1 to 3. The semiconductor fabrication method S may include preparing a substrate (in S1) and testing the substrate (in S2).

The testing of the substrate (in S2) may include transmitting an ultrasonic wave to the substrate (in S21) and receiving a reflection ultrasonic wave reflected by a portion in the substrate (in S22). A reflection ultrasonic wave is also referred to herein as a reflected ultrasonic wave.

Prior to transmitting the ultrasonic wave by the ultrasonic wave transmitting device 3, or while transmitting the ultrasonic wave, the ultrasonic wave transmitting device 3, and the first and second ultrasonic wave receiving devices 11 and 13 (e.g., including the first and second apertures 113 and 133 as well as the first and second probes 111 and 131) may be positioned at desired horizontally separated locations on the substrate W. The receiving of the reflection ultrasonic wave (in S22) may include the disposing of the first aperture on the substrate (in S221), disposing of the second aperture on the substrate (in S222), receiving a reflection ultrasonic wave transmitted through the first aperture (in S223), and receiving a reflection ultrasonic wave transmitted through the second aperture (in S224). The above steps need not be performed in the order shown in FIG. 4. For example, steps S221 and S222 may be performed before step S21 or at the same time as step S21.

Hereinafter, the semiconductor fabrication method S of FIG. 4 will be described in more detail with reference to FIGS. 5 to 7.

Figure 5:
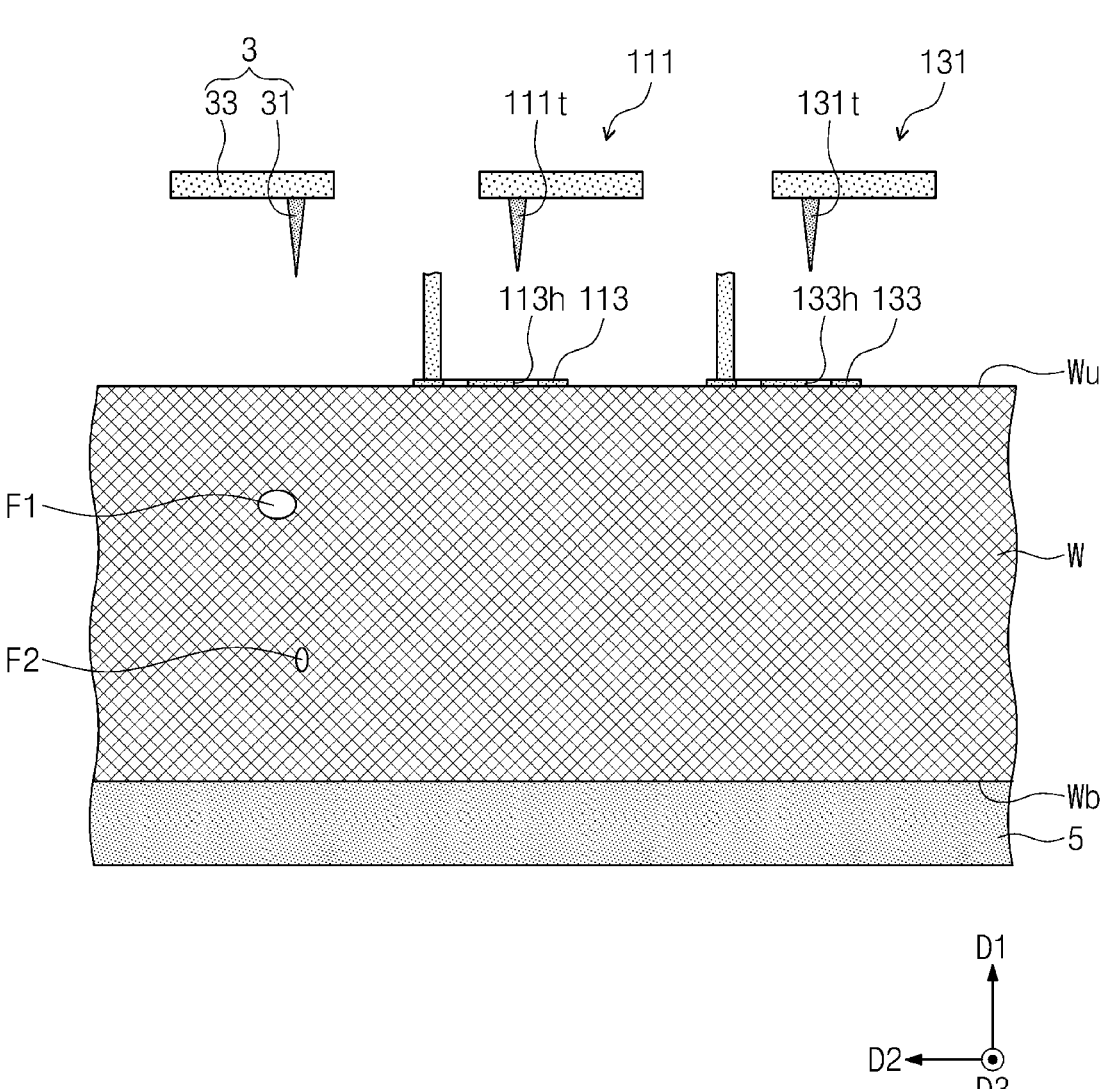
FIGS. 5 to 7 are sectional views sequentially illustrating the semiconductor fabrication method according to the flow chart of FIG. 4.
Figure 6:
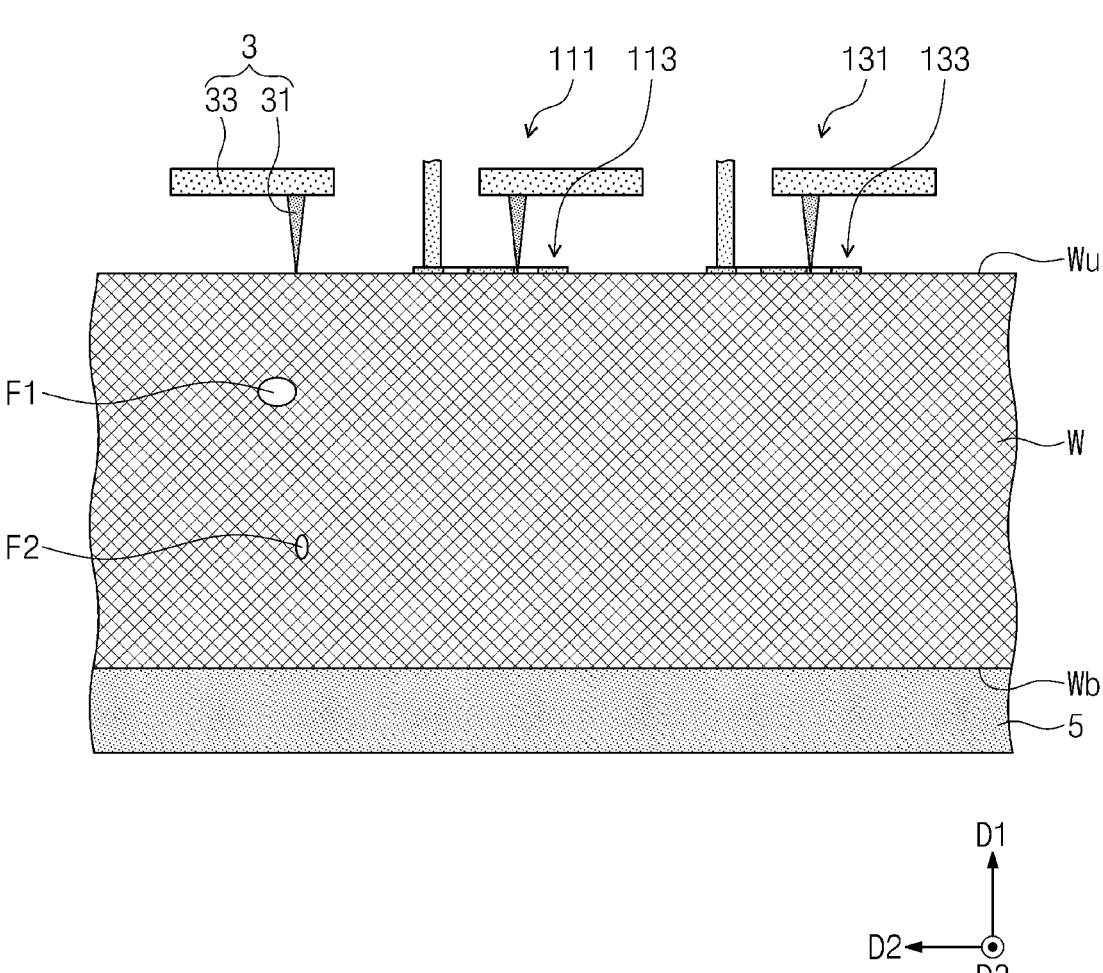
Figure 7:
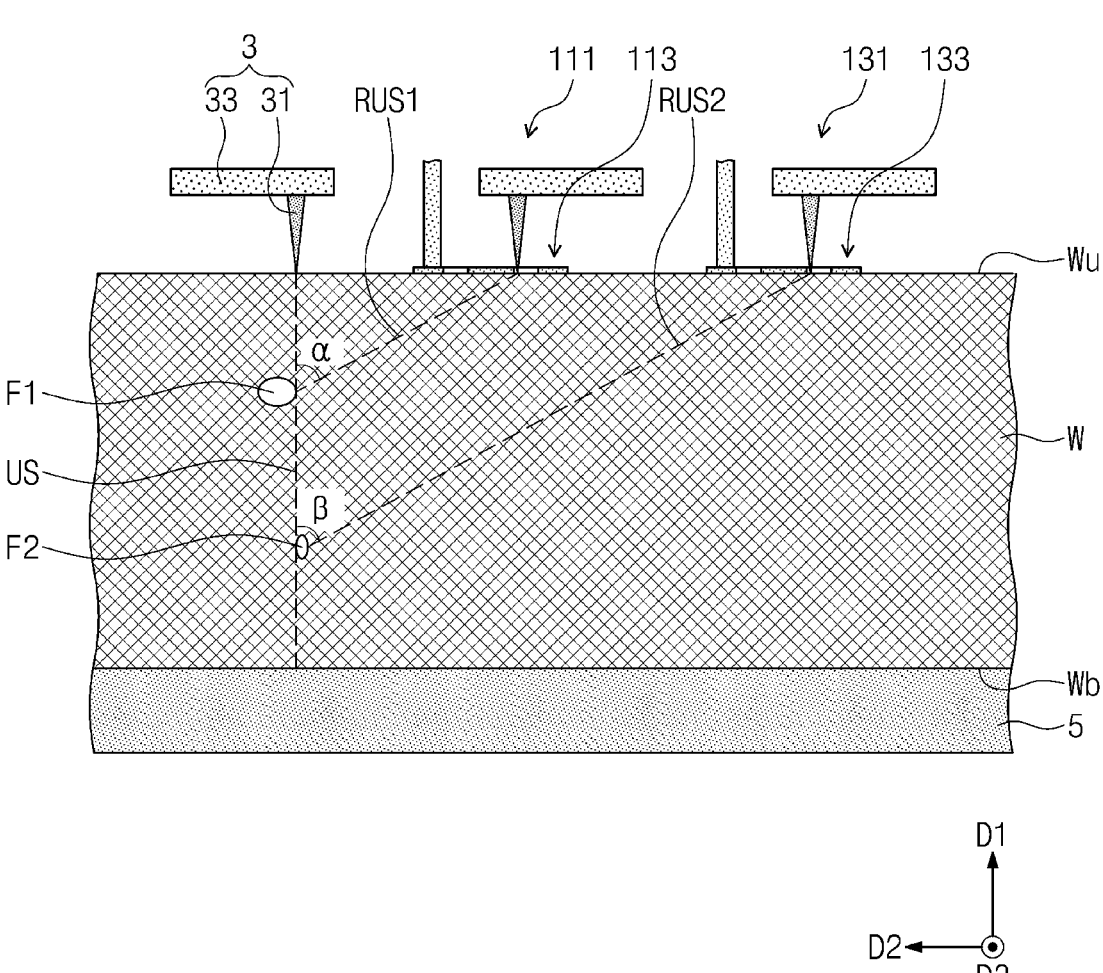

FIGS. 5 to 7 are sectional views sequentially illustrating the semiconductor fabrication method according to the flow chart of FIG. 4.

Referring to FIGS. 4 and 5, the preparing of the substrate (in S1) may include preparing the substrate W, on which various processes are performed. More specifically, a coating process, an exposure process, an etching process, and/or a deposition process may be performed to prepare the substrate W. As a result of these processes, a plurality of layers may be formed on the substrate W. A defect may occur in the plurality of layers. A plurality of defects may occur. For example, a first defect F1 and a second defect F2 may occur, as shown in FIG. 5. Two defects may be vertically spaced apart from each other in the substrate W. As one example, each of the first and second defects F1 and F2 may be a void (e.g., which may be detected based on its shape or appearance as compared to the shape or appearance of not-defective components), but the inventive concept is not limited to this example.

The disposing of the first aperture (in S221) may include disposing the first aperture 113 on the surface Wu of the substrate W at a particular horizontal location. When the first aperture 113 is disposed on the surface Wu of the substrate W, a portion of the surface Wu of the substrate W may be exposed through the ultrasonic wave receiving hole 113h.

The disposing of the second aperture on the substrate (in S222) may include disposing the second aperture 133 on the surface Wu of the substrate W at a particular location different from the location of the first aperture. The second aperture 133 may be spaced apart from the first aperture 113. When the second aperture 133 is disposed on the surface Wu of the substrate W, a portion of the surface Wu of the substrate W may be exposed through a second ultrasonic wave receiving hole 133h. The first aperture 113 and second aperture 133 may be disposed on the substrate by being placed on a surface of the substrate (e.g., to contact the surface).

Referring to FIGS. 4, 5, and 6, the first ultrasonic wave receiving probe 111 may be disposed at a first reception position on the surface Wu of the substrate W. More specifically, the first tip 111t may be provided to pass through the ultrasonic wave receiving hole 113h of the first aperture 113 and in contact the surface Wu of the substrate W. The first tip 111t may be located at a first horizontal location on the surface Wu of the substrate W. However, the inventive concept is not limited to this example, and in an embodiment, at the first horizontal location, the first tip 111t may be disposed at a position that is spaced apart from the surface Wu of the substrate W by a specific distance in an upward direction.

In addition, the second ultrasonic wave receiving probe 131 may be disposed at a second reception position on the surface Wu of the substrate W. More specifically, a second tip 131t may be provided to pass through the ultrasonic wave receiving hole 133h of the second aperture 133 and to contact the surface Wu of the substrate W. However, the inventive concept is not limited to this example, and in an embodiment, the second tip 131t may be disposed at a position that is spaced apart from the surface Wu of the substrate W by a specific distance in an upward direction. The second tip 131t may be located at a second horizontal location on the surface Wu of the substrate W. The first horizontal location and second horizontal location may be horizontally spaced apart from each other.

Referring to FIGS. 4 and 7, the transmitting of the ultrasonic wave to the substrate (in S21) may include transmitting an ultrasonic wave US toward the substrate W using the ultrasonic wave transmitting device 3. More specifically, the ultrasonic wave transmitting device 3 may be configured to vertically transmit the ultrasonic wave US from the surface Wu of the substrate W into the substrate W. The ultrasonic wave US may propagate from the surface Wu of the substrate W toward an opposite surface Wb of the substrate W in the vertical direction. If there is a defect on the propagation path of the ultrasonic wave US, a fraction of the ultrasonic wave US may be reflected. For example, if the first defect F1 is located on the propagation path of the ultrasonic wave US, a fraction of the ultrasonic wave US may be reflected to produce a first reflection ultrasonic wave RUS1. The first reflection ultrasonic wave RUS1 may propagate in all directions. In addition, if the second defect F2 is located on the propagation path of the ultrasonic wave US, a fraction of the second defect F2 may be reflected to produce a second reflection ultrasonic wave RUS2. The second reflection ultrasonic wave RUS2 may propagate in all directions.

The receiving of the reflection ultrasonic wave transmitted through the first aperture (in S223) may include receiving the reflection ultrasonic wave using the first ultrasonic wave receiving probe 111. Since the first ultrasonic wave receiving probe 111 receives only the reflection ultrasonic wave that is transmitted through the first aperture 113, the first ultrasonic wave receiving probe 111 may receive only a fraction of the reflection ultrasonic wave reflected at a specific angle. For example, as shown in FIG. 7, only the first reflection ultrasonic wave RUS1, which is reflected from the first defect F1 at a first angle α, may be received by the first ultrasonic wave receiving probe 111. That is, the first ultrasonic wave receiving probe 111 may not receive the second reflection ultrasonic wave RUS2 reflected from the second defect F2.

The receiving of the reflection ultrasonic wave transmitted through the second aperture (in S224) may include receiving the reflection ultrasonic wave using the second ultrasonic wave receiving probe 131. Since the second ultrasonic wave receiving probe 131 receives only the reflection ultrasonic wave that is transmitted through the second aperture 133, the second ultrasonic wave receiving probe 131 may receive only a fraction of the reflection ultrasonic wave reflected at a specific angle. For example, as shown in FIG. 7, only the second reflection ultrasonic wave RUS2, which is reflected from the second defect F2 at a second angle β, may be received by the second ultrasonic wave receiving probe 131. Therefore, the second ultrasonic wave receiving probe 131 may not receive the first reflection ultrasonic wave RUS1 reflected from the first defect F1. The second angle β may be substantially equal or similar to the first angle α, but the inventive concept is not limited to this example.

Thus, according to this arrangement, based on the aperture used, and the horizontal positions of the ultrasonic wave transmitting device 3, first ultrasonic receiving device 11, and second ultrasonic receiving device 13, as well as the characteristics of the reflected ultrasonic waves formed by a defect, geometric equations can be used to detect defects at different vertical levels within the substrate W, and can be used to map a three-dimensional location of the defects. The ultrasonic wave transmitting device 3, first ultrasonic receiving device 11, and second ultrasonic receiving device 13 can be moved to be in different horizontal locations, such that based on their known locations and geometry, the vertical locations of defects can be detected.

Based on the detection of defects, the control unit C can analyze the defects, and determine whether to discard a particular semiconductor device based on the detected defect. For example, the control unit C can indicate a location of the defect, and in some cases, automated analysis can be used to indicate whether a particular semiconductor device should be discarded and not included in a final product, or whether it should be included in a final product. A semiconductor device refers to a semiconductor chip, for example formed on a wafer, or a semiconductor package. If it is indicated that the semiconductor device should be included in a final product, additional steps may be performed, such as packaging the device into a package (if the device being inspected is not yet formed in a package), and/or singulating the device from a wafer.

In a semiconductor device testing apparatus according to an embodiment of the inventive concept and methods of testing and fabricating a semiconductor device using the same, a plurality of ultrasonic wave receiving probes may be used to receive a reflection ultrasonic wave. Thus, in the case where there are a plurality of defects in a single substrate, the defects may be separately detected by the ultrasonic wave receiving probes.

In a semiconductor device testing apparatus according to an embodiment of the inventive concept and methods of testing and fabricating a semiconductor device using the same, an aperture may be used to receive a reflection ultrasonic wave in a filtered manner. More specifically, an ultrasonic wave receiving probe may be configured to receive only a reflection ultrasonic wave passing through the aperture, and thus, only a reflection ultrasonic wave, which is reflected from a specific position in a substrate at a specific angle, may be received by the ultrasonic wave receiving probe. Thus, a plurality of defects may be separately identified. For example, by using multiple apertures and multiple ultrasonic wave receiving probes, it may be possible to accurately examine the number, positions, and/or types of defects. Accordingly, it may be possible to perform an accurate testing process on the substrate.

Figure 8:
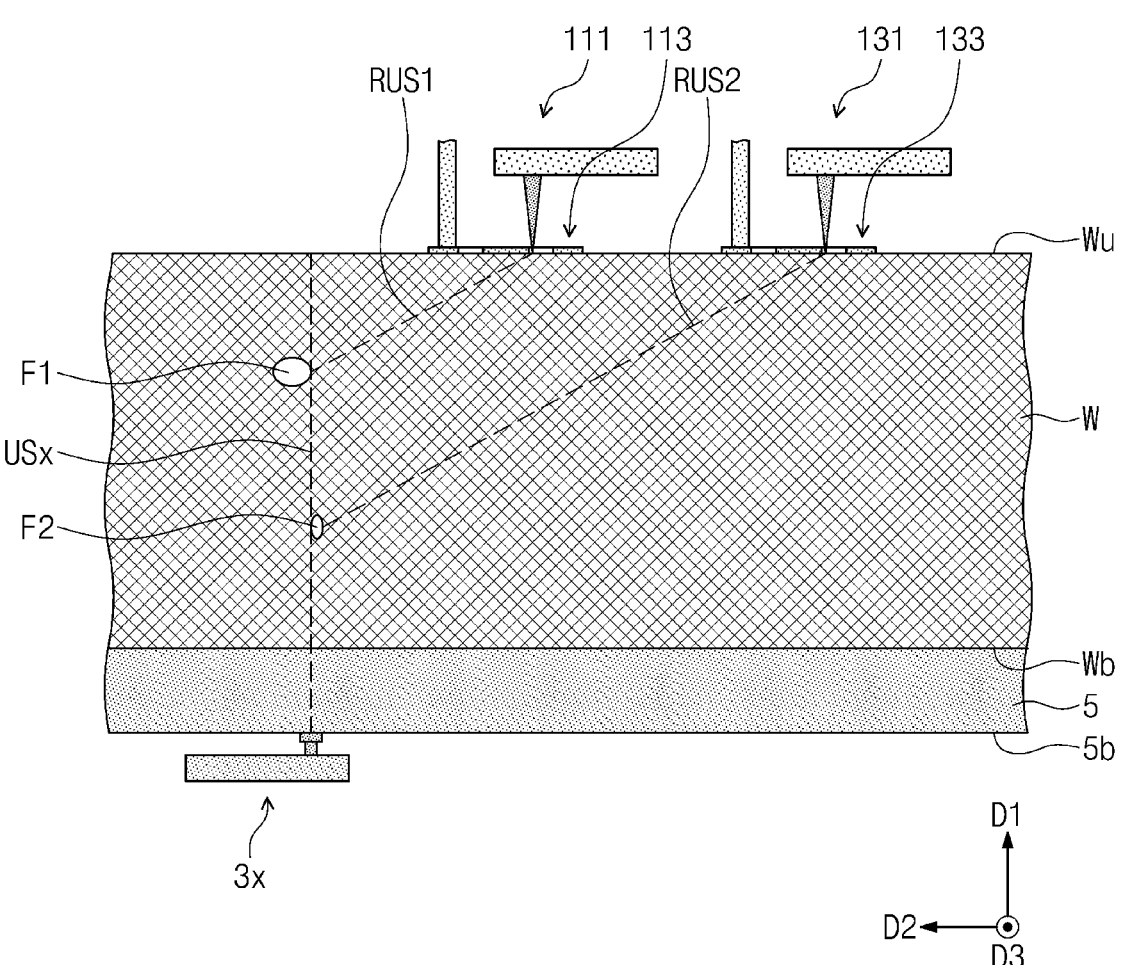
FIG. 8 is a sectional view illustrating the semiconductor fabrication method according to the flow chart of FIG. 4.

FIG. 8 is a sectional view illustrating the semiconductor fabrication method according to the flow chart of FIG. 4.

In the following description, for concise description, an element previously described with reference to FIGS. 1 to 7 may be identified by the same reference number without repeating an overlapping description thereof.

Referring to FIG. 8, the ultrasonic wave transmitting device 3x may be placed below the substrate W. For example, the ultrasonic wave transmitting device 3x may be placed on a bottom surface 5b of the stage 5. The ultrasonic wave transmitting device 3x may be configured to transmit an ultrasonic wave USx from a region, which is located on the opposite surface Wb of the substrate W, toward the substrate W. The ultrasonic wave USx, which is transmitted from the ultrasonic wave transmitting device 3x, may propagate from the opposite surface Wb of the substrate W toward the surface Wu of the substrate W. For example, the ultrasonic transmitting device 3x may include a portion that contacts the bottom surface 5b of the stage 5.

In a semiconductor device testing apparatus according to an embodiment of the inventive concept and methods of testing and fabricating a semiconductor device using the same, an ultrasonic wave may be transmitted from a region below a substrate into the substrate. Thus, an ultrasonic wave transmitting device may be placed on an opposite surface of the substrate. An ultrasonic wave receiving device may be disposed on a surface of the substrate. Accordingly, a degree of freedom in disposing devices may be increased, compared with the case that both of the ultrasonic wave transmitting device and the ultrasonic wave receiving device are disposed on the surface of the substrate. Thus, it may be possible to perform the test process in various manners.

Figure 9:
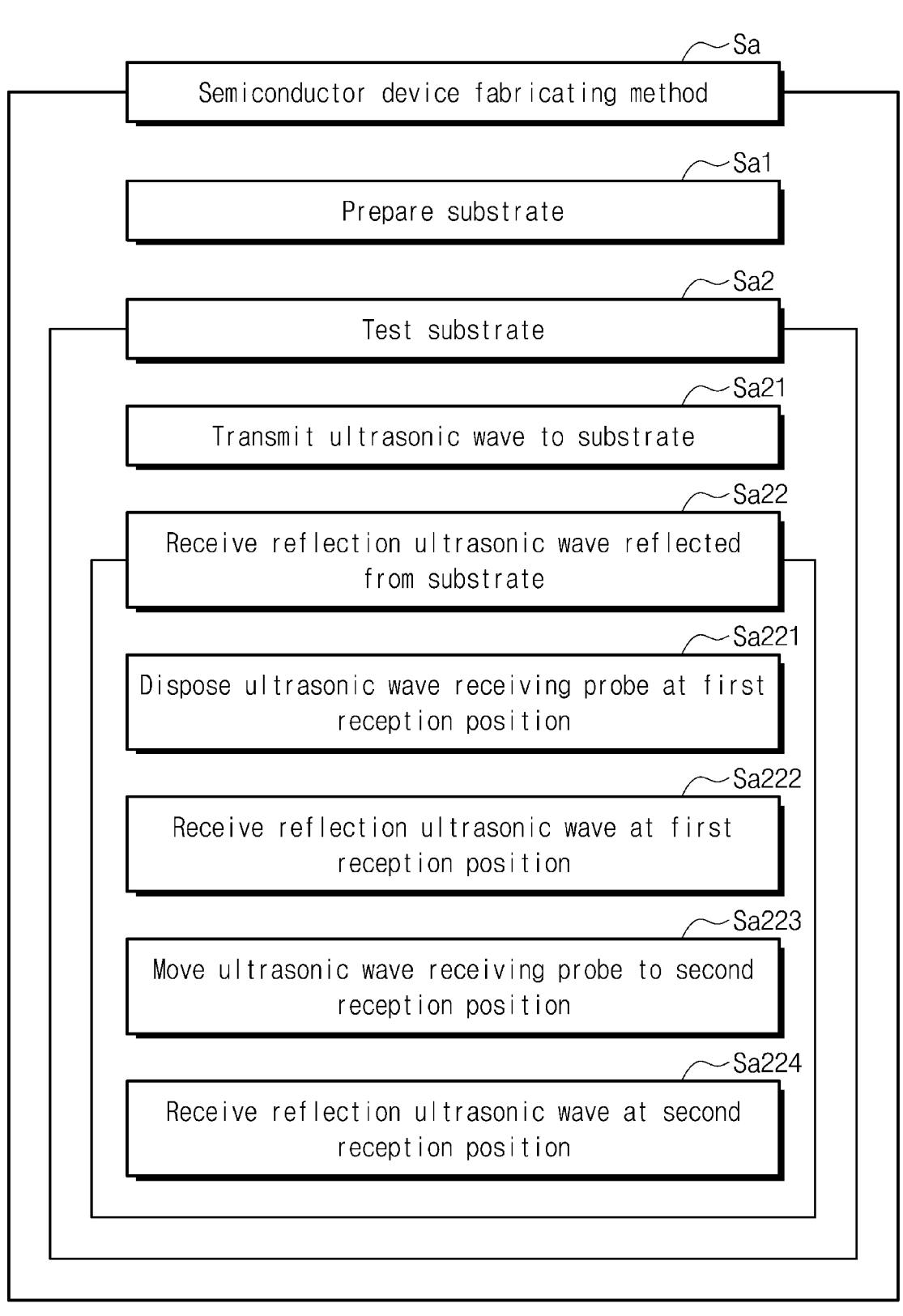
FIG. 9 is a flow chart illustrating a method of fabricating a semiconductor device, according to an embodiment of the inventive concept.

FIG. 9 is a flow chart illustrating a method of fabricating a semiconductor device, according to an embodiment of the inventive concept.

In the following description, for concise description, an element previously described with reference to FIGS. 1 to 8 may be identified by the same reference number without repeating an overlapping description thereof.

Referring to FIG. 9, a method of fabricating a semiconductor device (in Sa) may be provided. The semiconductor fabrication method Sa may include preparing a substrate (in Sa1) and testing the substrate (in Sa2).

The testing of the substrate (in Sa2) may include transmitting an ultrasonic wave to the substrate (in Sa21) and receiving a reflection ultrasonic wave reflected by a portion in the substrate (in Sa22). For example, the portion in the substrate may be a defect that is recognizable based on its particular appearance (e.g., based on the characteristics of the reflection ultrasonic wave reflected by the portion).

The receiving of the reflection ultrasonic wave (in Sa22) may include disposing an ultrasonic wave receiving probe at a first reception position (in Sa221), receiving a reflection ultrasonic wave at the first reception position (in Sa222), moving the ultrasonic wave receiving probe to a second reception position (in Sa223), and receiving a reflection ultrasonic wave at the second reception position (in Sa224). Steps Sa221, Sa222, and Sa223 may occur while the ultrasonic wave transmitting device 3 is in a stationary location. Therefore, if a defect is detected for a particular horizontal reception position of the ultrasonic wave receiving probe, the vertical location of the defect can be determined.

The preparing of the substrate (in Sa1) and the transmitting of the ultrasonic wave (in Sa21) may be performed in the same manner as the corresponding steps described with reference to FIG. 4.

Hereinafter, an example of the receiving of the reflection ultrasonic wave (in Sa22) sequentially described with reference to FIGS. 10 to 11.

Figure 10:
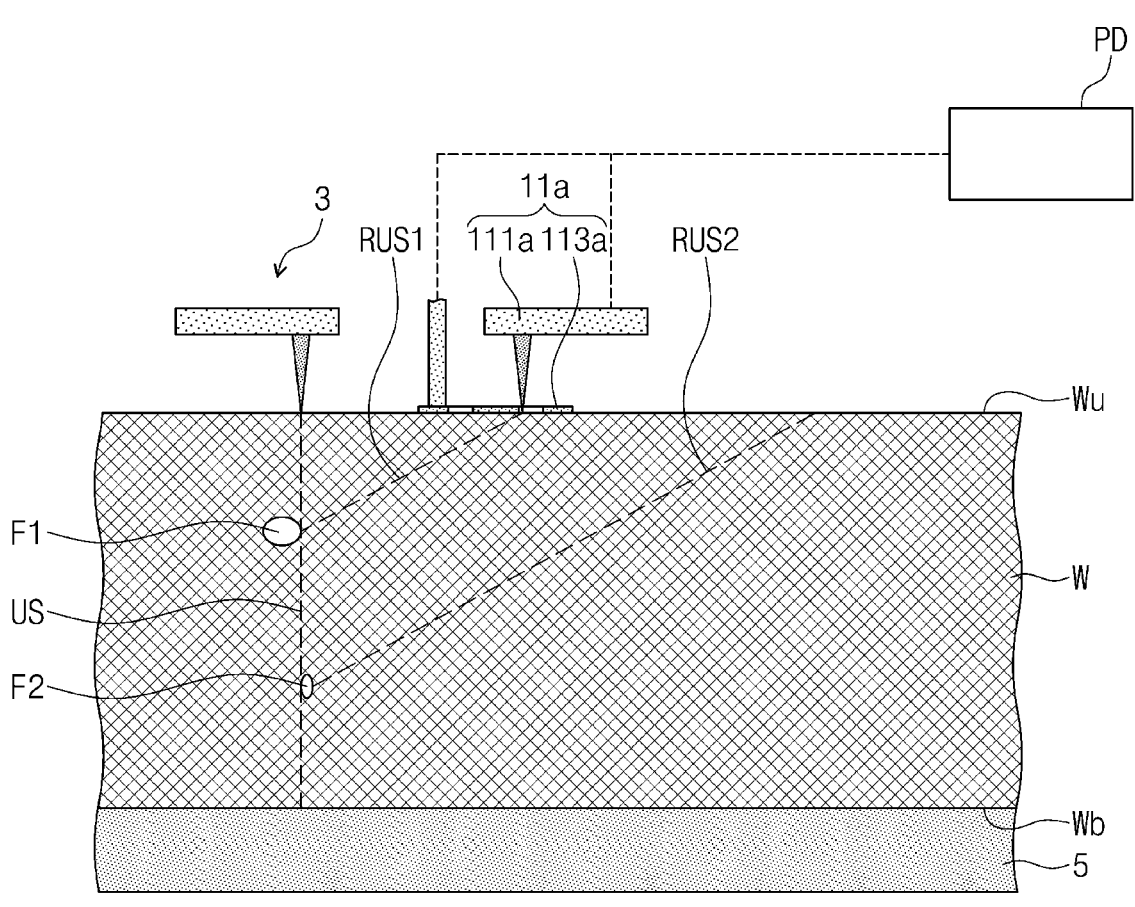
FIGS. 10 and 11 are sectional views sequentially illustrating the semiconductor fabrication method according to the flow chart of FIG. 9.
Figure 11:
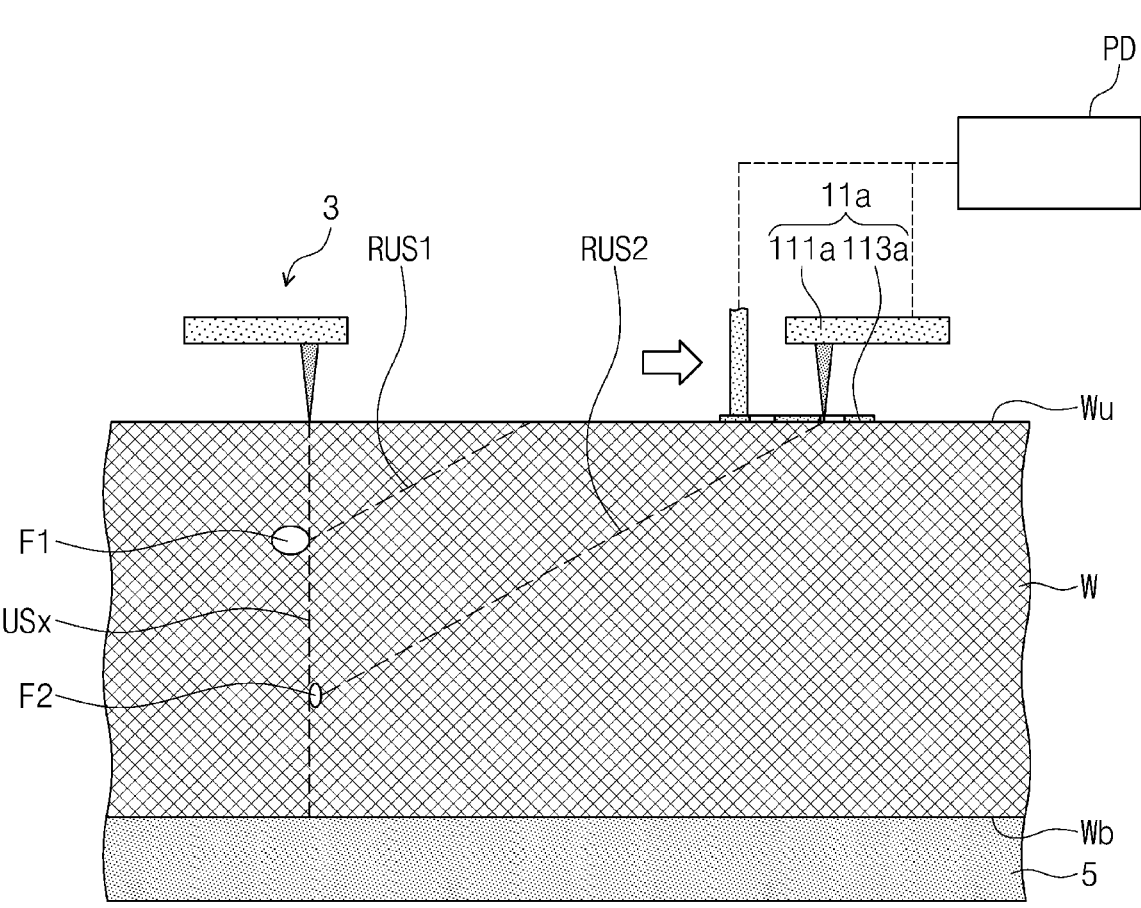

FIGS. 10 to 11 are sectional views sequentially illustrating the semiconductor fabrication method according to the flow chart of FIG. 9.

Referring to FIGS. 9 and 10, the disposing of the ultrasonic wave receiving probe at the first reception position (in Sa221) may include disposing an ultrasonic wave receiving device 11a at the first reception position on the surface Wu of the substrate W. More specifically, an ultrasonic wave receiving probe 111a may be placed at the first reception position (e.g., first horizontal position) on the surface Wu of the substrate W. The first reception position may be an intersection of the propagation path of the first reflection ultrasonic wave RUS1, which is reflected from the first defect F1 at the first angle, and the surface Wu of the substrate W. Here, an aperture 113a may also be disposed on the surface Wu of the substrate W, but the inventive concept is not limited to this example.

The receiving of the reflection ultrasonic wave at the first reception position (in Sa222) may include receiving the first reflection ultrasonic wave RUS1, which is reflected from the first defect F1, using the ultrasonic wave receiving probe 111a, through the aperture 113a.

Referring to FIGS. 9 and 11, the moving of the ultrasonic wave receiving probe to the second reception position (in Sa223) may include horizontally moving the ultrasonic wave receiving probe 111a on the surface Wu of the substrate W. The ultrasonic wave receiving probe 111a may be moved from the first reception position to the second reception position. The second reception position may be an intersection of the propagation path of the second reflection ultrasonic wave RUS2, which is reflected from the second defect F2 at the second angle, and the surface Wu of the substrate W. Here, the aperture 113a may also be moved, but the inventive concept is not limited to this example. For example, a second aperture may be placed at the second reception position so that the first aperture does not need to be moved. As discussed in certain claims "an aperture" when used twice in the same claim may refer to either the same aperture or different apertures. In an embodiment, the ultrasonic wave receiving device 11*a* may be moved by the receiving device driving part PD. For example, the receiving device driving part PD may be configured to move the ultrasonic wave receiving probe 111*a* and/or the aperture 113*a* on the surface Wu of the substrate W in the horizontal direction.

The receiving of the reflection ultrasonic wave at the second reception position (in Sa224) may include receiving the second reflection ultrasonic wave RUS2, which is reflected from the second defect F2, using the ultrasonic wave receiving probe 111*a*.

In a semiconductor device testing apparatus according to an embodiment of the inventive concept and methods of testing and fabricating a semiconductor device using the same, it may be possible to receive reflection ultrasonic waves, which are reflected from various positions in a substrate, using a single ultrasonic wave receiving device. Accordingly, it may be possible to detect defects at various positions.

Figure 12:
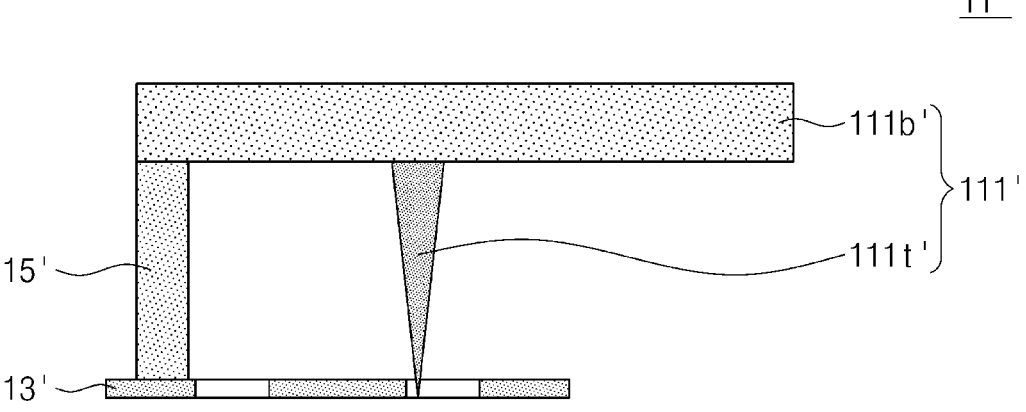
FIG. 12 is a sectional view illustrating an ultrasonic wave receiving device according to an embodiment of the inventive concept.

FIG. 12 is a sectional view illustrating an ultrasonic wave receiving device according to an embodiment of the inventive concept.

Referring to FIG. 12, an ultrasonic wave receiving device 11' may be provided. The ultrasonic wave receiving device 11' may include an ultrasonic wave receiving probe 111', an aperture 13', and a connection member 15'. The ultrasonic wave receiving probe 111' may include a first tip 111*t'* and a first probe body 111*b'*. The aperture 13' may be connected to the ultrasonic wave receiving probe 111' through the connection member 15'. For example, the aperture 13' may be fastened to the first probe body 111*b'* by the connection member 15' coupled to a top surface of the aperture 13'. FIG. 12 illustrates an example in which the aperture 13' is fastened to the ultrasonic wave receiving probe 111' by the separate connection member 15', but the inventive concept is not limited to this example. For example, the aperture 13' may be directly coupled and fastened to the first tip 111*t'*. It will be understood that when an element is referred to as being "connected" or "coupled" to or "on" another element, it can be directly connected or coupled to or on the other element or intervening elements may be present. In contrast, when an element is referred to as being "directly connected" or "directly coupled" to another element, or as "contacting" or "in contact with" another element (or using any form of the word "contact"), there are no intervening elements present at the point of contact.

In a semiconductor device testing apparatus according to an embodiment of the inventive concept and methods of testing and fabricating a semiconductor device using the same, the aperture and the ultrasonic wave receiving probe may be provided to form a single object. Thus, when the ultrasonic wave receiving device is moved, the aperture and the ultrasonic wave receiving probe may be moved together. A relative distance between the aperture and the ultrasonic wave receiving probe may be uniform, always. Accordingly, it may be possible to receive an ultrasonic wave in a precise manner, even when an additional calibration operation is not performed.

In a semiconductor device testing apparatus according to an embodiment of the inventive concept and methods of testing and fabricating a semiconductor device using the same, a non-destructive testing method without a step of cutting a semiconductor device may be used to examine whether there is a defect in the semiconductor device.

In a semiconductor device testing apparatus according to an embodiment of the inventive concept and methods of testing and fabricating a semiconductor device using the same, an ultrasonic wave may be used to accurately examine a position and/or type of a defect.

In a semiconductor device testing apparatus according to an embodiment of the inventive concept and methods of testing and fabricating a semiconductor device using the same, defects at several positions of a single semiconductor device may be separately detected by a single test process.

While example embodiments of the inventive concept have been particularly shown and described, it will be understood by one of ordinary skill in the art that variations in form and detail may be made therein without departing from the spirit and scope of the attached claims.

What is claimed is:

1. A method of fabricating a semiconductor device, comprising:

disposing a first aperture on a surface of a substrate;

positioning a first ultrasonic wave receiving probe on the surface of the substrate in the first aperture;

disposing a second aperture on the surface of the substrate;

positioning a second ultrasonic wave receiving probe on the surface of the substrate in the second aperture;

transmitting an ultrasonic wave to the substrate; and receiving a reflection ultrasonic wave, which is reflected by a portion in the substrate, wherein the receiving of the reflection ultrasonic wave comprises one of:

receiving the reflection ultrasonic wave, which is transmitted through the first aperture, using the first ultrasonic wave receiving probe positioned on the surface of the substrate; or receiving the reflection ultrasonic wave, which is transmitted through the second aperture, using the second ultrasonic wave receiving probe positioned on the surface of the substrate, and wherein the first ultrasonic wave receiving probe and the second ultrasonic wave receiving probe are spaced apart from each other in a horizontal direction.

2. The method of claim 1, wherein the transmitting of the ultrasonic wave to the substrate comprises transmitting the ultrasonic wave in a vertical direction using an ultrasonic wave transmitting device.

3. The method of claim 2, wherein:

the receiving of the reflection ultrasonic wave transmitted through the first aperture comprises receiving a first reflection ultrasonic wave, which is reflected from a first internal position in the substrate, using the first ultrasonic wave receiving probe, the receiving of the reflection ultrasonic wave transmitted through the second aperture comprises receiving a second reflection ultrasonic wave, which is reflected from a second internal position in the substrate, using the second ultrasonic wave receiving probe, and the first internal position and the second internal position are vertically spaced apart from each other in the substrate.

4. The method of claim 3, wherein:

a distance between the ultrasonic wave transmitting device and the second ultrasonic wave receiving probe is larger than a distance between the ultrasonic wave transmitting device and the first ultrasonic wave receiving probe, and the second internal position is positioned below the first internal position.

5. The method of claim 2, wherein the transmitting of the ultrasonic wave to the substrate comprises transmitting the ultrasonic wave from the surface of the substrate using the ultrasonic wave transmitting device.

6. The method of claim 2, wherein the transmitting of the ultrasonic wave to the substrate comprises transmitting the ultrasonic wave from an opposite surface of the substrate, which is opposite to the surface, using the ultrasonic wave transmitting device.

7. A method of fabricating a semiconductor device, comprising:

transmitting an ultrasonic wave to a substrate;

disposing an ultrasonic wave receiving probe through an aperture at a first reception position on a surface of the substrate;

moving the ultrasonic wave receiving probe and disposing the moved ultrasonic wave receiving probe through an aperture at a second reception position on the surface; and receiving a reflection ultrasonic wave, which is reflected by a portion in the substrate, wherein the receiving of the reflection ultrasonic wave comprises one of:

receiving a first reflection ultrasonic wave at the first reception position using the ultrasonic wave receiving probe;

or receiving a second reflection ultrasonic wave at the second reception position using the moved ultrasonic wave receiving probe, and wherein the first reception position and the second reception position are spaced apart from each other in a horizontal direction.

8. The method of claim 7, wherein the ultrasonic wave is a first ultrasonic wave transmitted in a vertical direction to the substrate at a first transmission position on the substrate, and further comprising:

transmitting a second ultrasonic wave in a vertical direction to the substrate at a second transmission position on the substrate;

disposing the ultrasonic wave receiving probe through the aperture at the first reception position on a surface of the substrate;

moving the ultrasonic wave receiving probe and disposing the moved ultrasonic wave receiving probe through the aperture at the second reception position on the surface of the substrate; and receiving an additional reflection ultrasonic wave, which is reflected by a portion in the substrate, wherein the receiving of the additional reflection ultrasonic wave comprises one of:

receiving the additional reflection ultrasonic wave at the first reception position using the ultrasonic wave receiving probe;

and receiving the additional reflection ultrasonic wave at the second reception position using the moved ultrasonic wave receiving probe.

9. The method of claim 7, wherein the receiving of the first reflection ultrasonic wave at the first reception position using the ultrasonic wave receiving probe comprises receiving the first reflection ultrasonic wave, which is reflected from a first internal position in the substrate, using the ultrasonic wave receiving probe, and the receiving of the second reflection ultrasonic wave at the second reception position using the ultrasonic wave receiving probe comprises receiving the second reflection ultrasonic wave, which is reflected from a second internal position in the substrate, using the ultrasonic wave receiving probe.

10. The method of claim 9, wherein the first internal position and the second internal position are vertically spaced apart from each other in the substrate.

11. The method of claim 10, wherein the transmitting of the ultrasonic wave to the substrate comprises vertically transmitting the ultrasonic wave from a transmission position on the substrate toward the substrate, using an ultrasonic wave transmitting device, a distance between the second reception position and the transmission position is larger than a distance between the first reception position and the transmission position, and the second internal position is positioned below the first internal position.

12. The method of claim 7, wherein the each aperture is configured to allow the ultrasonic wave receiving probe to receive ultrasound waves only arriving at a particular angle or range of angles.

13. A method of testing a semiconductor device, comprising:

transmitting an ultrasonic wave to a substrate; and receiving a reflection ultrasonic wave, which is reflected by a portion in the substrate, wherein the receiving of the reflection ultrasonic wave comprises:

disposing an aperture on a surface of the substrate; and receiving the reflection ultrasonic wave, which is transmitted through the aperture, using an ultrasonic wave receiving probe positioned on the surface of the substrate.

14. The method of claim 13, wherein the aperture is a first aperture disposed at a first reception position on the surface; and further comprising:

disposing a second aperture at a second reception position on the surface;

transmitting an additional ultrasonic wave to the substrate; and receiving an additional reflection ultrasonic wave, which is reflected by a portion in the substrate, wherein the receiving of the additional reflection ultrasonic wave comprises:

receiving the additional reflection ultrasonic wave, which is transmitted through the second aperture, using an additional ultrasonic wave receiving probe positioned on the surface of the substrate wherein the receiving of the reflection ultrasonic wave, which is transmitted through the first aperture, using the ultrasonic wave receiving probe comprises:

receiving the reflection ultrasonic wave, which is transmitted through the first aperture, using a first ultrasonic wave receiving probe on the first reception position; and wherein the receiving of the additional reflection ultrasonic wave, which is transmitted through the second aperture, using the additional ultrasonic wave receiving probe comprises receiving the additional reflection ultrasonic wave, which is transmitted through the second aperture, using the additional ultrasonic wave receiving probe on the second reception position.

15. The method of claim 14, wherein the receiving of the reflection ultrasonic wave transmitted through the first aperture comprises receiving a first reflection ultrasonic wave, which is reflected from a first internal position in the substrate, using the ultrasonic wave receiving probe, the receiving of the additional reflection ultrasonic wave transmitted through the second aperture comprises receiving a second reflection ultrasonic wave, which is reflected from a second internal position in the substrate, using the additional ultrasonic wave receiving probe, and the first internal position and the second internal position are vertically spaced apart from each other in the substrate.

16. The method of claim 13, wherein the aperture comprises:

an inner blocking member; and an outer blocking member provided to enclose the inner blocking member, when viewed in a plan view, wherein an ultrasonic wave receiving hole is provided between the inner blocking member and the outer blocking member.

17. The method of claim 13, wherein the transmitting of the ultrasonic wave to the substrate comprises transmitting the ultrasonic wave from the surface of the substrate into the substrate using an ultrasonic wave transmitting device.

18. The method of claim 13, wherein the transmitting of the ultrasonic wave to the substrate comprises transmitting the ultrasonic wave from an opposite surface of the substrate, which is opposite to the surface, into the substrate using an ultrasonic wave transmitting device.

\* \* \* \* \*